United States Patent
Ketola et al.

(10) Patent No.: US 11,111,256 B2
(45) Date of Patent: Sep. 7, 2021

(54) HIGH PURITY TRISILYLAMINE, METHODS OF MAKING, AND USE

(71) Applicant: Jiangsu Nata Opto-Electronic Materials Co. Ltd., Jiangsu (CN)

(72) Inventors: Barry M. Ketola, Freeland, MI (US); Jesse A. Maddock, Midland, MI (US); Brian D. Rekken, Midland, MI (US); Michael D. Telgenhoff, Midland, MI (US); Xiaobing Zhou, Midland, MI (US)

(73) Assignee: Jiangsu Nata Opto-Electronic Materials Co. Ltd., Jiangsu Province (CN)

( * ) Notice: Subject to any disclaimer, the term of this patent is extended or adjusted under 35 U.S.C. 154(b) by 420 days.

(21) Appl. No.: 16/061,477

(22) PCT Filed: Dec. 16, 2016

(86) PCT No.: PCT/US2016/067143
§ 371 (c)(1),
(2) Date: Jun. 12, 2018

(87) PCT Pub. No.: WO2017/106625
PCT Pub. Date: Jun. 22, 2017

(65) Prior Publication Data
US 2020/0262849 A1 Aug. 20, 2020

(51) Int. Cl.
| | | |
|---|---|---|
| *C07F 7/10* | (2006.01) | |
| *C07F 7/20* | (2006.01) | |
| *C07F 7/02* | (2006.01) | |
| *B01J 31/14* | (2006.01) | |
| *C01B 21/087* | (2006.01) | |
| *C01B 33/027* | (2006.01) | |
| *C08G 77/62* | (2006.01) | |
| *C23C 16/455* | (2006.01) | |
| *C07F 7/08* | (2006.01) | |
| *C23C 16/34* | (2006.01) | |
| *H01L 21/02* | (2006.01) | |

(52) U.S. Cl.
CPC ............ *C07F 7/10* (2013.01); *B01J 31/146* (2013.01); *C01B 21/087* (2013.01); *C01B 33/027* (2013.01); *C07F 7/025* (2013.01); *C07F 7/0803* (2013.01); *C07F 7/20* (2013.01); *C08G 77/62* (2013.01); *C23C 16/345* (2013.01); *C23C 16/45553* (2013.01); *H01L 21/02208* (2013.01); *B01J 2231/005* (2013.01); *B01J 2531/002* (2013.01)

(58) Field of Classification Search
CPC .......... C07F 7/10; C07F 7/025; C07F 7/0803; C07F 7/20; B01J 31/146; B01J 2231/005; B01J 2531/002; B01J 2219/00736; B01J 2219/00162; B01J 2219/00051; C01B 21/087; C01B 33/027; C01B 21/092; C08G 77/62; C08G 85/004; C23C 16/45553; C23C 16/345; H01L 21/02208; H01L 21/02123; H01L 21/02532; C08F 8/42

See application file for complete search history.

(56) References Cited

U.S. PATENT DOCUMENTS

| | | | | |
|---|---|---|---|---|
| 4,675,424 | A * | 6/1987 | King, III | C07F 7/10 556/412 |
| 6,391,803 | B1 * | 5/2002 | Kim | C23C 16/452 438/787 |
| 7,875,312 | B2 * | 1/2011 | Thridandam | H01L 21/31633 427/248.1 |
| 9,284,198 | B2 | 3/2016 | Agarwal et al. | |
| 2011/0136347 | A1 * | 6/2011 | Kovarsky | H01L 21/02222 438/758 |
| 2013/0089487 | A1 * | 4/2013 | Ritter, III | C01B 21/087 423/324 |
| 2015/0094470 | A1 | 4/2015 | Sanchez et al. | |
| 2016/0237099 | A1 * | 8/2016 | Sanchez | C07F 7/025 |

FOREIGN PATENT DOCUMENTS

EP 2818448 12/2014

OTHER PUBLICATIONS

Search report for corresponding Taiwan Application No. 105141895 dated Jul. 23, 2020.

\* cited by examiner

*Primary Examiner* — Anthony J Zimmer
*Assistant Examiner* — Syed T Iqbal
(74) *Attorney, Agent, or Firm* — Morgan, Lewis & Bockius LLP

(57) ABSTRACT

A composition, comprising: trisilylamine and less than 5 ppmw of halogen. A method of making a silylamine comprising combining ammonia and a compound comprising aminosilane functionality, where the compound comprising aminosilane functionality is according to formula (I) $R^1 N(R^2)_a(SiH_3)_{2-a}$ (I), where $R^1$ is an organic polymer, a $C_{1-20}$ hydrocarbyl group or $—SiR^3{}_3{}^1$, where $R^3$ is $C_{1-6}$ hydrocarbyl, $R^2$ is a $C_{1-20}$ hydrocarbyl group, H, or $—SiR^3{}_3{}^1$, where $R^3$ is as defined above, subscript a is 0 or 1, provided that $R^1$ and $R^2$ may be the same or different except if $R^1$ is phenyl, $R^2$ is not phenyl, under sufficient conditions to cause a reaction to form a silylamine and a byproduct.

8 Claims, No Drawings

HIGH PURITY TRISILYLAMINE, METHODS OF MAKING, AND USE

CROSS REFERENCE TO RELATED APPLICATIONS

This application is a U.S. national stage filing under 35 U.S.C. § 371 of PCT Application No. PCT/US16/067143 filed on 16 Dec. 2016, currently pending, which claims the benefit of U.S. Provisional Patent Application No. 62/269,286 filed 18 Dec. 2015 under 35 U.S.C. § 119 (e). PCT Application No. PCT/US16/067143 and U.S. Provisional Patent Application No. 62/269,286 are hereby incorporated by reference.

FIELD OF THE INVENTION

The present invention relates, generally, to a composition comprising trisilyamine and less than 5 ppmw halogen, methods of making silylamine, methods of making films with the trisilylamine composition, and the films produced from the trisilylamine compositions.

BACKGROUND OF THE INVENTION

Trisilylamine (TSA) has industrial applications including use as a precursor for the deposition of silicon-containing films in photovoltaic and electronic applications. A significant industrial process for making TSA comprises the reaction of monochloroosilane with ammonia. In addition to TSA, this process produces chlorine-containing byproducts such as ammonium chloride. These byproducts are unwanted in the end-use applications for TSA. For example, halogen is detrimental in the process of forming silicon-containing films in chemical vapor deposition processes using TSA. Therefore, the lowest amount of halogen possible is desired in these applications.

TSA has also been produced through the reaction of dislylamine and removal of ammonia as a byproduct. However, halogen may also present in TSA produced from this process because halogen can be introduced in the process to make the disilylamine.

Processes have been developed to remove halogen from TSA once it is produced. However, the reduction of halogen from TSA is difficult, and the processes used can add significant cost to the production of TSA, increase byproducts, reduce yields, and fail to eliminate halogen completely.

Therefore, a need exists for a low halogen or halogen-free TSA composition and for an economical processes to produce a low halogen or halogen-free TSA composition in good yield.

BRIEF SUMMARY OF THE INVENTION

The present invention is directed to a composition comprising trisilylamine and less than 5 ppmw of halogen.

The present invention is further directed to a method of making a silylamine, the method comprising: combining ammonia and a compound comprising aminosilane functionality, where the compound is according to formula (I)

$$R^1N(R^2)_a(SiH_3)_{2-a} \quad (I),$$

where $R^1$ is an organic polymer, a $C_{1\text{-}20}$ hydrocarbyl group or $-SiR^3{}_3$, where each $R^3$ independently is $C_{1\text{-}6}$ hydrocarbyl, each $R^2$ independently is a $C_{1\text{-}20}$ hydrocarbyl group, H, or $-SiR^3{}_3{}^1$, where each $R^3$ independently is as defined above, subscript a is 0 or 1, provided that $R^1$ and $R^2$ may be the same or different except if $R^1$ is phenyl, $R^2$ is not phenyl, under sufficient conditions to cause a reaction to form a silylamine and a byproduct.

The present invention is further directed to a further method of making a silylamine, the method comprising:
i) combining
A) a compound comprising a primary or secondary amine,
B) monosilane ($SiH_4$), and
C) a catalyst, where the catalyst comprises magnesium or boron,
where A), B) and C) are combined under sufficient conditions to form an aminosilane compound and hydrogen, and
ii) combining ammonia and the aminosilane compound produced in i) under sufficient conditions to form a silylamine and a byproduct.

The present invention is further directed to a method of forming a silicon-containing film, the method comprising: subjecting a composition comprising trisilylamine and less than 5 ppmw halogen to deposition conditions in the presence of a substrate to form a silicon-containing film on the substrate.

The present invention is further directed to a silicon-containing film formed by a method comprising subjecting a composition comprising trisilylamine and less than 5 ppmw halogen to deposition conditions in the presence of a substrate to form a silicon-containing film on the substrate.

The TSA composition of the instant invention have low or no halogen. Therefore, the compositions produce silicon-containing films of high purity with improved properties over existing TSA compositions. The methods of the invention produce aminosilane and TSA compositions with reduced halogen content economically and in good yield. films by chemical vapor deposition with improved film properties. Further, the methods of the invention produces a TSA composition economically with no, or very little, halogen content. Still further, the method of the invention, produces films with improved properties from the TSA composition of the invention.

The methods of making TSA may be used to produce TSA compositions comprising very low or no halogen content. The TSA produced can be used to produce silicon-containing films in chemical vapor deposition processes. The films of the present invention may be used in electronic and photovoltaic applications.

DETAILED DESCRIPTION OF THE INVENTION

The Brief Summary and Abstract are incorporated here by reference.

As used herein, ppmw is the abbreviation for parts per million by weight (w/w).

As used herein, "no detectable amount" means that no amount of halogen can be detected in the composition using methods published or otherwise known at the time of filing.

As used herein, "precatalyst" means a compound that when combined with a mixture of other compounds that reacts with one of the other compounds to form a catalyst for another reaction between the other reactants in the mixture.

A composition, comprising: trisilylamine and less than 5 ppmw of halogen.

The trisilylamine has the formula $(SiH_3)_3N$.

The composition comprises less than 5 ppmw, alternatively less than 1 ppmw, alternatively less than 0.1 ppmw, alternatively no detectable amount, alternatively no amount, of halogen.

The amount of halogen in the composition comprising trisilylamine is determined using methods known in the art such as elemental analysis. For example, the amount of halogen may be determined using atomic absorption (flame ionization or graphite furnace) or inductively coupled plasma atomic emission spectroscopy combined with mass spectrometry, such as inductively coupled plasma mass spectrometry. One skilled in the art would know how to determine the amount of halogen is a composition comprising trisilylamine.

The halogen includes fluorine, chlorine, bromine, or iodine, alternatively fluorine, chlorine or bromine, alternatively chlorine or bromine, alternatively chlorine.

A method of making a silylamine, the method comprising: combining ammonia and a compound comprising aminosilane functionality, where the compound comprising aminosilane functionality is according to formula (I)

  (I), where $R^1$ is an organic polymer, a $C_{1-20}$ hydrocarbyl group or $—SiR^3{}_3$, where each $R^3$ independently is $C_{1-6}$ hydrocarbyl, $R^2$ is a $C_{1-20}$ hydrocarbyl group, H, or $—SiR^3{}_3{}^1$, where each $R^3$ independently is as defined above, subscript a is 0 or 1, provided that $R^1$ and $R^2$ may be the same or different except if $R^1$ is phenyl, $R^2$ is not phenyl, under sufficient conditions to cause a reaction to form a silylamine and a byproduct.

The organic polymers represented by $R^1$ may be, but are not limited to, polyalkylene, polyester, polyurethane, polyacrylate, and polysiloxane, and may have a linear, branched, star, or any other structure known in the art for organic polymers. The organic polymers may be made by methods known in the art. The aminosilane functionality can be included in the polymer by copolymerization with a monomer with the aminosilane functionality. For example, an aminosilane comprising vinyl or allylic functionality can be copolymerized with other organic monomers including, but not limited to, other organic vinyl, ester, or acrylic monomers. Alternatively, the aminosilane functionality may be grafted onto the polymer through reaction of an aminosilane having a functional group which reacts with a group on the backbone of an existing polymer. For example, an aminosilane having Si—H my react with an unsaturated group of the polymer in a hydrosilation reaction. One skilled in the art would understand how to make polymers with the aminosilane functionality as defined by formula (I). Organic polymers comprising aminosilane functionality are available commercially.

The hydrocarbyl groups represented by $R^1$ typically have from 1 to 20, alternatively from 1 to 12, alternatively from 1 to 6, alternatively from 1 to 4, alternatively from 2 to 4, alternatively 3, carbon atoms. Acyclic hydrocarbyl groups having at least 3 carbon atoms can have a linear or branched structure. Examples of hydrocarbyl groups represented by $R^1$ include, but are not limited to, alkyl, such as methyl, ethyl, propyl, isopropyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, hexyl, heptyl, octyl, nonyl, decyl, undecyl, dodecyl, pentadecyl, hexadecyl, icosyl; cycloalkyl, such as cyclopentyl, cyclohexyl, and methylcyclohexyl; aryl, such as phenyl and naphthyl; alkaryl such as tolyl and xylyl, aralkyl, such as benzyl and penethyl; alkenyl, such as vinyl, allyl, propenyl, butenyl, hexenyl, and octenyl; arylalkenyl, such as styryl and cinnamyl, and alkynyl, such as ethynyl and proynyl.

The hydrocarbyl groups represented by $R^2$ are as described for $R^1$.

The hydrocarbyl groups represented by $R^3$ typically have from 1 to 6, alternatively from 1 to 3, alternatively from 1 to 3, alternatively 1, alternatively 2, alternatively 3, carbon atoms. Acyclic hydrocarbyl groups having at least 3 carbon atoms can have a linear or branched structure. Examples of hydrocarbyl groups represented by $R^1$ include, but are not limited to, those defined above for $R^1$ and having from 1 to 6 carbon atoms.

Subscript "a" may be 0 or 1, alternatively 0, alternatively 1.

The groups represented by $R^1$ and $R^2$ may be the same or different, with the proviso that both $R^1$ and $R^2$ are not both be phenyl. If $R^1$ and $R^2$ are phenyl, the melting point of the compound comprising aminosilane functionality is above room temperature creating issues in production with material handling due to elevated temperature requirements, column clogging, and difficult separation of the resulting amine and product, all of which can create higher safety issues.

Examples of the compound comprising aminosilane functionality include, but are not limited to, methylamino silane, ethylamino silane, ispropylamino silane, propylamino silane, 1-methylpropylamino silane, pentylamino silane, 1-methylbutylamino silane, hexylamino silane, pheylamino silane, cyclohexylamino silane, heptylamino silane, octylamino silane, nonylamino silane, decylamino silane, undecylamino silane, decylamino silane, pentadecylamino silane, octadecylamino silane, cosylamino silane, dimethylamino silane, diethylamino silane, diisopropylamino silane, dipropylamino silane, di-1-methylpropylamino silane, dipentylamino silane, di-1-methylbutylamino silane, dihexylamino silane, dicyclohexylamino silane, diheptylamino silane, dioctylamino silane, dinonylamino silane, didecylamino silane, diundecylamino silane, dodecylamino silane, dipentadecylamino silane, dioctadecylamino silane, dicosylamino silane, methylethylamino silane, methylpropylamino silane, methylisopropylamino silane, methylbutylamino silane, 1-methylpropylmethylamino silane, methylphenylamino silane, methylcyclohexylamino silane, methylocytlyamino silane, 1-methylheptylmethylamino silane, ethylethylamino silane, ethylpropylamino silane, ethylisopropylamino silane, ethylbutylamino silane, 1-methylpropylethylamino silane, ethylphenylamino silane, ethylcyclohexylamino silane, ethylocytlyamino silane, 1-methylheptylethylamino silane, propylbutylamino silane, isopropylbutylamino silane, propylisobutylamino silane, isopropylisobutylamino silane, propylpentylamino silane, isopropylpentylamino silane, propylphenylamino silane, isopropylphenylamino silane, isopropylcyclohexylamino silane, propyloctylamino silane, propyldodecylaminosilane. One method of forming the compound comprising aminosilane functionality is described below, where a primary or secondary amine is reacted with monosilane ($SiH_4$). Some of the compounds comprising aminosilane functionality are available commercially.

The combining is done by contacting the ammonia with the compound comprising aminosilane functionality in a reactor. One skilled in the art would know how to contact ammonia and the compound comprising aminosilane functionality.

The method is conducted in a reactor. The reactor is suitable for reacting ammonia and the compound comprising aminosilane functionality. For example, the method can be conducted in a Parr reactor or a sealed tube. A chilled reactor may be used as well. One skilled in the art would understand how to select an appropriate reactor for the method.

The combining is at conditions sufficient to cause the reaction of the ammonia and the compound comprising aminosilane functionality. The "conditions sufficient" are a temperature and pressure to cause the reaction, alternatively at a temperature from −20 to 150° C. and a pressure form 0 to 300 kPa(g), alternatively a temperature from 0 to 50° C. and a pressure from 45 to 250 kPa(g). Generally, the required pressure increases with increasing temperature. One skilled in the art would know how to select temperature and pressure conditions to cause the reaction.

The combining may further comprise agitating the reactants. The agitating may enhance mixing and contacting together of the reactants and additional ingredients in the reaction mixture.

The combining of the ammonia and the compound comprising aminosilane functionality may be done in an inert atmosphere or a non-inert atmosphere. For example, the reactor may be placed under vacuum prior to the contacting and/or purged with nitrogen prior to the contacting.

The ammonia and the compound comprising aminosilane functionality are typically combined in a mole ratio of ammonia to the compound comprising aminosilane functionality of from 0.1 to 100, alternatively from 1 to 10, alternatively 0.20 to 1, alternatively 0.25 to 1, alternatively 0.30 to 1.

The ammonia and the compound comprising aminosilane functionality can be combined in any order. Typically the compound comprising aminosilane functionality is added to the reactor, which is then pressurized with ammonia.

The time for the combining can vary by temperature. Typically the combining is from a few seconds up to days, alternatively from 5 minutes to 5 hours, alternatively from 15 minutes to 2 hours. The combining may be conducted until the disappearance of one or more of the reactants or appearance of the product. The appearance and disappearance of the reactants and product may be monitored by methods known in the art such as, but not limited to, $^{29}$Si NMR and/or $^1$H nuclear magnetic resonance (NMR) spectroscopy.

The method may further comprise combining the ammonia and the compound comprising aminosilane functionality in a solvent. Examples of solvent include, but are not limited to, ether-based solvents, alkanes, aromatic solvents, and the like.

The method forms a silylamine, alternatively trisilylamine, and a byproduct. The byproduct is the amine remaining after the aminosilane functionality of the compound comprising aminosilane functionality is reacted in the method. The aminosilane functionality of the compound comprising aminosilane functionality in the method is replaced by a hydrogen atom to produce an amine. In one embodiment, the byproduct is a primary or secondary amine according to formula (III) described below.

The silylamine formed by the method may be recovered. The silylamine may be recovered from the byproduct and any unreacted aminosilane by common separation techniques such as distillation. One skilled in the art would know how to recover the silylamine.

A method of making a silylamine, the method comprising:
i) combining
A) a compound comprising a primary or secondary amine,
B) monosilane (SiH$_4$), and
C) a catalyst, where the catalyst comprises magnesium or boron,
where A), B) and C) are combined under sufficient conditions to form an aminosilane compound and hydrogen, and
ii) combining ammonia and the aminosilane compound produced in i) under sufficient conditions to form a silylamine and a byproduct.

The compound comprising a primary or secondary amine A), the monosilane (SiH$_4$) B), and the catalyst C), where the catalyst comprises magnesium or boron, are combined under sufficient conditions to form an aminosilane compound and hydrogen.

In one embodiment, the compound comprising a primary or secondary amine is any primary or secondary amine. In another embodiment, the compound comprising a primary or secondary amine in i) is according to formula (III):

$$R^1N(R^2)_aH_{2-a} \qquad (III),$$

where R$^1$ is an organic polymer, C$_{1-20}$ hydrocarbyl, or —SiR$^3{}_3$, where each R$^3$ independently is C$_{1-6}$ hydrocarbyl, R$^2$ is C$_{1-20}$ hydrocarbyl, H, —SiH$_3$, or SiR$^3{}_3$, where R$^3$ is as defined above, and subscript a is 0 or 1, alternatively 0, alternatively 1.

The groups represented by R$^1$, R$^2$, and R$^3$ are as described above for the compound comprising aminosilane functionality.

Examples of the primary and secondary amine include, but are not limited to, methylamine, ethylamine, ispropylamine, propylamine, 1-methylpropylamine, pentylamine, 1-methylbutylamine, hexylamine, pheylamine, cyclohexylamine, heptylamine, octylamine, nonylamine, decylamine, undecylamine, decylamine, pentadecylamine, octadecylamine, cosylamine, dimethylamine, diethylamine, diispropylamine, dipropylamine, di-1-methylpropylamine, dipentylamine, di-1-methylbutylamine, dihexylamine, dicyclohexylamine, diheptylamine, dioctylamine, dinonylamine, didecylamine, diundecylamine, dodecylamine, dipentadecylamine, dioctadecylamine, dicosylamine, methylethylamine, methylpropylamine, methylisopropylamine, methylbutylamine, 1-methylpropylmethylamine, methylphenylamine, methylcyclohexylamine, methylocytlyamine, 1-methylheptylmethylamine, ethylethylamine, ethylpropylamine, ethylisopropylamine, ethylbutylamine, 1-methylpropylethylamine, ethylphenylamine, ethylcyclohexylamine, ethylocytlyamine, 1-methylheptylethylamine, propylbutylamine, isopropylbutylamine, propylisobutylamine, isopropylisobutylamine, propylpentylamine, isopropylpentylamine, propylphenylamine, isopropylphenylamine, isopropylcyclohexylamine, propyloctylamine, propyldodecylamine. One skilled in the art would know how to make the primary or secondary amine. Many of these compounds are available commercially.

The monosilane is SiH$_4$. One skilled in the art would know how to produce monosilane.

The catalyst comprises magnesium or boron. The boron catalyst is according to formula BR$^4{}_3$, where each R$^4$ independently is a C$_{1-10}$ substituted or unsubstituted hydrocarbyl, alternatively C$_{4-8}$ substituted or unsubstituted hydrocarbyl, alternatively six carbon substituted or unsubstituted hydrocarbyl, alternatively substituted phenyl. The substituents comprising the substitution on the hydrocarbyl groups R$^4$ include halogen, alternatively F, Cl, or Br, alternatively F of Cl, alternatively F.

Examples of the catalyst comprising boron include, but are not limited to, trimethylborane, triethylborane, triphenylborane and tris(pentafluorophenyl)borane. In one embodiment, the catalysts is tris(pentafluorophenyl)borane.

The catalyst comprising magnesium is a bis(dihydrocarbylamino)magnesium represented by formula $(R^5_2N)_2Mg$, wherein each $R^5$ independently is a hydrocarbyl group having from 1 to 20 carbon atoms, alternatively from 1 to 12, alternatively from 1 to 6, alternatively from 1 to 4, alternatively from 2 to 4, alternatively 3, carbon atoms. The hydrocarbyl groups represented by $R^5$ are as described above for $R^1$ in formula (I) above.

Examples of the catalyst comprising magnesium include, but are not limited to, bis(dimethylamino) magnesium, bis(diethylamino) magnesium, bis(diisopropylamino) magnesium, bis(dipropylamino) magnesium, bis(di-1-methylpropylamino) magnesium, bis(dipentylamino) magnesium, bis(di-1-methylbutylamino) magnesium, bis(dihexylamino) magnesium, bis(dicyclohexylamino) magnesium, bis(diheptylamino) magnesium, bis(dioctylamino) magnesium, bis(dinonylamino) magnesium, bis(didecylamino) magnesium, bis(diundecylamino) magnesium, bis(dodecylamino) magnesium, bis(dipentadecylamino) magnesium, bis(dioctadecylamino) magnesium, bis(dicosylamino) magnesium.

In one embodiment, the catalyst is combined with A) and B) by combining a pre-catalyst that forms the catalyst C) after combined. The pre-catalyst is a dihydrocarbylmagnesium of formula $R^5_2Mg$, wherein each $R^5$ independently is as described above for the catalyst C), or a bis(dihydrocarbylamino)magnesium of formula $Mg(NR^6_2)_2$, where each $R^6$ independently is hydrocarbyl having from 1 to 10 carbon atoms or trimethylsilyl.

Hydrocarbyl groups represented by $R^6$ have 1 to 10 carbon atoms, alternatively 1 to 8 carbon atoms, alternatively 1 to 6 carbon atoms. Examples of hydrocarbyl groups represented by $R^6$ are as described above for $R^1$ having the requisite number of carbon atoms. In one embodiment, the groups represented by $R^6$, include, but are not limited to, alkyl having from 1 to 6 carbon atoms such as methyl, ethyl, propyl, butyl, pentyl, hexyl, phenyl, and their isomers. In another embodiment, the groups represented by $R^6$ are trimethylsilyl.

Examples of the pre-catalyst according to the formula $R^5_2Mg$ include, but are not limited to, dimethylmagnesium, diethylmagnesium, diisopropylmagnesium, dipropylmagnesium, di-1-methylpropylmagnesium, dipentylmagnesium, di-1-methylpropylmagnesium, dihexylmagnesium, dicyclohexylmagnesium, diheptylmagnesium, dioctylmagnesium, dinonylaminemagnesium, didecylmagnesium, diundecylmagnesium, dodecylmagnesium, dipentadecylaminemagnesium, dioctadecylmagnesium, dicosylmagnesium. In one embodiment the $R^5$ of the precatalyst is a branch alkyl group having from 2 to 6 carbon atoms, alternatively diisopropylmagnesium, alternatively dibutylmagnesium, alternatively di-isobutylmagnesium, alternatively di-n-butylmagnesium.

Examples of pre-catalyst according to the formula $Mg(NR^6_2)_2$ include, but are not limited to, bis(diisopropylamino) magnesium, bis(diethylamino) magnesium, bis(diphenylamino) magnesium, bis(dioctylamino) magnesium, bis(ditrimethylsilylamino)magnesium, and those materials listed as the catalyst above.

The dihydrocarbylmagnesium may be prepared by methods know in the art. For example, the dihydrocarbylmagnesium can be prepared by adding at least one equivalent of dioxane to a solution of hydrocarbylmagnesium halide.

A), B) and C) are combined in i) under sufficient conditions to form an aminosilane compound and hydrogen. As used herein, "sufficient conditions" means at a temperature and pressure and for a time to cause the reaction to proceed, alternatively a temperature from 0 to 300° C., alternatively from 20 to 200° C., alternatively from 75 to 125° C., at a pressure from sub-atmospheric to super-atmospheric, alternatively from sub-atmospheric to 3500 kPa(g), alternatively from 0 kPa(g) to 3500 kPa, alternatively from 5 kPa(g) to 2100 kPa(g), alternatively from 250 to 1800 kPa(g), and a time from 1 minute to 2 days, alternatively from 1 hr to 8 hrs.

The combining of A), B), and C) may be done in an inert atmosphere or a non-inert atmosphere. For example, the reactor for the combining may be placed under vacuum prior to the contacting and/or purged with nitrogen prior to the contacting.

The combining of A), B), and C) may be conducted until the disappearance of one or more of the reactants or appearance of the organoaminosilane. The appearance and disappearance of the reactants and product may be monitored by methods known in the art such as, but not limited to, $^{29}Si$ NMR and/or $^1H$ nuclear magnetic resonance (NMR) spectroscopy.

In one embodiment, the aminosilane compound formed is any aminosilane that can be formed by the combined in any primary or secondary amine and monosilane. In another embodiment, the aminosilane compound formed is the compound comprising aminosilane functionality according to formula (I) in the method of making a silylamine described above.

A), B), and C) may be combined in any order in i). In one embodiment, A) and C) are combined before B) is combined, alternatively B) and C) are combined before A) is combined with B) and C), alternatively A) and B) are combined then C).

A) and B) are combined in a molar ratio of A) to B) of from 0.001 to 1000, alternatively from 0.01 to 100, alternatively from 0.1 to 10, alternatively from 0.33 to 3.

The catalyst comprising magnesium or boron is combined in a catalytic effective amount. A catalytic effective amount of catalyst comprising magnesium or boron means an amount that will catalyze the reaction of A) and B) at the specific concentration of A) and B), alternatively an amount of catalyst that is up to 10% (w/w), alternatively from 0.0001 to 5% (w/w), alternatively from 0.01 to 2% (w/w), alternatively from 0.1 to 1% (w/w), based on the weight of A).

A), B), and C) may further be combined with D) a solvent. The solvent, D), is a liquid at the temperature and pressure conditions of the reaction. In one embodiment, D) is non-electron donating, alternately non-electron donating hydrocarbon, alternatively an alkane. The non-electron donating hydrocarbon or alkane solvent comprises from 5 to 18, alternatively from 6 to 10 carbon atoms. Electron donating solvent may be used as D) but non-electron-donating is preferred.

Examples of the solvent include alkanes, such as, but not limited to, pentane, hexane, heptane, octane, nonane, decane, undecane, dodecane pentadecane, hexadecane, isocane, and the isomers thereof. In one embodiment, the combining in i) comprises hexane, heptane, or octane.

The solvent D) may be combined in any order. Typically, the solvent D) is combined with A) and C) prior to combining with B), alternatively with C) then A) prior to combining with B).

A), B), C) and, when present, D) are combined in i) a reactor. One skilled in the art would know how to select a reactor for the combination of A), B), C) and D). For example, a pressure reactor such as a Parr reactor may be used.

The aminosilane produced in i) may be purified or otherwise treated or combined with other materials before being used in ii).

Ammonia and the aminosilane compound produced in i) are combined in ii) under sufficient conditions to form a silylamine and a byproduct.

The silylamine formed in ii) is any silylamine formed by the combination of the aminosilane compound produced in i) with ammonia, alternatively the silylamine is disilylamine (($SiH_3$)$_2$NH) or trisilylamine (($SiH_3$)$_3$N), alternatively trisilylamine.

The silylamine formed in ii) has less than 5 ppmw, alternatively less than 1 ppmw, alternatively less than 0.1 ppmw, based on the weight of the silylamine, of halogen, alternatively bromine or chlorine, alternatively chlorine. In one embodiment, the silylamine has no detectable amount of halogen.

In one embodiment the silylamine formed in ii) is as described above for the composition comprising trisilylamine having less than 5 ppmw of halogen.

The byproduct formed in ii) comprises at least a primary or secondary amine. In one embodiment, the byproduct comprises a primary or secondary amine according to formula (III) described above.

The aminosilane compound from i) is combined in ii) with ammonia under sufficient conditions to form a silylamine and a byproduct. The conditions sufficient to form the silylamine are as described above for the method of producing a silylamine comprising combining ammonia and a compound comprising aminosilane functionality, where the compound comprising aminosilane functionality is according to formula (I). The conditions used in the different combining steps may be the same as or different than the conditions use din any other contacting stop(s) and/or the separating steps described therein.

The ammonia and the aminosilane produced in i) are combined at a mole ratio of ammonia to the compound comprising aminosilane functionality of from 0.1 to 100, alternatively from 1 to 10, alternatively 0.25 to 1.

The ammonia and the aminosilane produced in i) are combined in a reactor as described for the combining in i). The same reactor may be used for the combining in i) and ii) or separate reactors may be used.

In one embodiment, the aminosilane formed in i) is recovered prior to the combining in ii). The aminosilane may be recovered by separating the aminosilane from the hydrogen formed and any remaining starting materials. For example, the aminosilane may be recovered by distillation, decantation, evaporation, extraction, filtration, freeze drying, gas chromatography, ion exchange chromatography, partitioning, phase separation, reverse phase liquid chromatography, stripping volatilization, and washing. One skilled in the art would know how to recover the aminosilane.

The method may further comprise recovering the silylamine produced in ii). The silylamine may be recovered from the byproduct and any unreacted aminosilane by one or more common separation techniques such as distillation, decantation, evaporation, extraction, filtration, freeze drying, gas chromatography, ion exchange chromatography, partitioning, phase separation, reverse phase liquid chromatography, stripping volatilization, and washing. One skilled in the art would know how to recover the silylamine.

The method may further comprise iii) recovering and combining the primary or secondary amine byproduct formed in ii) in i) as A). The primary or secondary amine byproduct may be recovered by methods known in the art such as distillation. The primary or secondary amine byproduct may be combined in i) as described for combining A) in i) above.

A method of forming a silicon-containing film, the method comprising: subjecting a composition comprising trisilylamine and less than 5 ppmw halogen to deposition conditions in the presence of a substrate to form a silicon-containing film on the substrate.

The composition comprising trisilylamine and less than 5 ppmw halogen is as described above.

The deposition conditions are those commonly used in the art in chemical vapor deposition processes such as atomic layer deposition and plasma enhanced atomic layer deposition.

The substrate can be any substrate commonly used to deposit silicon-containing films such as carbon, silicon, and silicon dioxide.

The film formed on a substrate formed by depositing the compositon comprising trisilylamine and less than 5 ppmw halogen is as described above.

The silylamine of the present invention is low- or no-halogen-containing. The method of the invention produced low- or no-halogen-containing silylamine economically and in good yield. Furthermore, the silylamine can be used in chemical deposition processes requiring low-halogen materials to produce silicon-containing films.

The silylamine of the invention and produced by the method of the invention is used in chemical vapor deposition processes to produce silicon-containing films. The invention may have additional advantages and uses, some of which may be described later.

Any reference to "invention" or an equivalent expression (e.g., the present invention, this invention or the invention) shall mean those representative inventive embodiments or aspects, and shall not be used to unduly limit inventive scope. Any reference to a Markush group may be equivalently expressed in different ways. E.g., a Markush group of members A, B, and C may be equivalently expressed as: "a member selected from A, B, and C"; "a member selected from the group consisting of A, B, and C"; or "a member A, B, or C". The Markush group may comprise two or more of a genus, a subgenus thereof, and one or more specific members thereof; each of which may be relied upon individually or collectively and provides adequate support for specific inventive embodiments.

Any use of alternatively shall indicate an independent embodiment. The articles "a", "an", and "the" each refer to one or more. Any reference to "comparative," as in comparative example, is for illustration purposes only and shall not mean something from the prior art.

Any reference to "contacting" or "combining" means bringing into physical contact. Any reference to "greater than", as in greater than a specified individual number (e.g., >50 or ≥50), encompasses a range or subrange that includes as its upper endpoint the absolute maximum (e.g., 100%) or, as the case may be where there is no absolute maximum, a practical maximum (e.g., 10,000 repeat units or 10,000,000 g/mol. Alternatively, the upper endpoint may be less than the absolute maximum (e.g., <100%) or less than the practical maximum (e.g., <10,000 repeat units or <10,000,000 g/mol). Any reference to "less than", as in less than a specified individual number (e.g., <10 or ≥10), encompasses a range or subrange that includes as its lower endpoint the absolute minimum (e.g., zero (0)) or, as the case may be where there is no absolute minimum, a practical minimum (e.g., greater than zero (>0). E.g., a practical minimum >0 is clear from the context of the expression "present at a concentration less than 10 wt %". Alternatively, the lower endpoint may be greater than the absolute minimum (e.g., >0%). Any use of "may" confers a choice, not an imperative. Any ranges relied upon herein describe and contemplate all ranges and subranges including endpoints and whole and/or fractional values therein. A disclosed endpoint or individual number between endpoints of a disclosed range or subrange may be relied upon and provides adequate support for specific inventive embodiments. Any reference to thereof shall refer to, and may be amended to be replaced by, that immediately preceding element, member, feature, limitation, list, or group to which reference is being made.

Any reference to an amount, concentration, or ratio of amounts is based on weight. Any reference to a "by-product" means a secondary product of a chemical transformation of one or more reactants. Any reference to "concentration" as a "percent" or "%" means weight percent (wt %) and is based on total weight of all ingredients used to make the material being described, which total weight is 100 wt %. Any reference to a "film" or "coating" means a material that is restricted in one dimension. The restricted dimension may be characterized as "thickness". Any reference to a material property (e.g., viscosity) or a test method for measuring same shall be that property measured at or that method conducted at 23 degrees Celsius (° C.) and 101.3 kilopascals (kPa). Any reference to a "molecular mass" of a molecule means molecular weight (MW) expressed in grams per mole. Any reference to "purify" means to increase concentration of a desired ingredient (up to ≤100%); alternatively to decrease concentration of one or more undesired ingredients (down to ≥0%), whether or not concentration of the desired ingredient has been increased; alternatively both. Any reference to "separation" means to cause to physically move apart, and thus as a result be no longer in direct touching. Any reference to "substrate" means a physical support having at least one surface upon which another material may be hosted. Any reference to a "vehicle" means a material acting as a carrier, hosting medium, dispersion medium, supernatant, or solvent for another material, which may or may not be soluble therein. The vehicle may be a liquid.

Any reference to a chemical element, a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/). IUPAC is the International Union of Pure and Applied Chemistry (IUPAC Secretariat, Research Triangle Park, N.C., USA). The intended meaning of any chemical term is that definition promulgated by IUPAC. Any reference to a "catalyst" means a homogeneous or heterogeneous catalyst, which may be supported or unsupported, and which may or may not be a composite catalyst. A homogeneous catalyst forms a solution with reactants and any vehicle. A heterogeneous catalyst is not soluble in the reactants and/or any vehicle present in the reaction. Any reference to "composition" means chemical matter that may be defined by an empirical formula of its constituent elements. Any organic group name ending in suffix "ene", such as hydrocarbylene, alkylene, alkenylene, alkynylene, arylene, phenylene, and the like, means a divalent radical group, which may be straight chain, branched chain, or cyclic. E.g., unsubstituted ($C_3$)hydrocarbylene includes cyclopropylene, methylethylene, and propylene, wherein cyclopropylene means cyclopropane-1,2-diyl; methylethylene means 1-methyl-ethane-1,2-diyl (i.e., propane-2,3-diyl) or 2-methyl-ethane-1,2-diyl (i.e., propane-1,2-diyl); and propylene means propane-1,3-diyl. Any organic group containing a C—H functionality independently may be unsubstituted or substituted with one or more substituents. An organic group may be monovalent (having one free valence), divalent (having two free valences), trivalent (having three free valences), or tetravalent (having four free valences), also known as univalent, bivalent, trivalent, and quadravalent. Examples of monovalent organic groups are organyl or organoheteryl groups. Examples of organyl groups are hydrocarbyl and heterohydrocarbyl groups. Examples of organoheteryl groups are hydrocarbylamino and hydrocarbyloxy groups. Examples of divalent organic groups are organylene and organoheterylene groups. Examples of organylene groups are hydrocarbylene and heterohydrocarbylene groups. Examples of organoheterylene groups are hydrocarbyleneamino and hydrocarbyleneoxy groups. Heterohydrocarbyl, heterohydrocarbylene, organoheteryl and organoheterylene groups contain one or more heteroatoms selected from O, N, S, and P; alternatively O, N, or S; alternatively O or N; alternatively N; alternatively O.

EXAMPLES

The following examples are presented to better illustrate the method of the present invention, but are not to be considered as limiting the invention, which is delineated in the appended claims. Unless otherwise noted, all parts and percentages reported in the examples are by weight. Room Temperature or ambient temperature are 23° C. unless otherwise noted. The following table describes the abbreviations used in the examples:

TABLE 2

List of abbreviations used in the examples.

| Abbreviation | Word |
|---|---|
| g | Gram |
| Me | Methyl |
| wt | Weight |
| ok | percent |
| mol | mole |
| hr | hour |
| ° C. | degrees Celsius |
| NA | Not Applicable |
| mL | milliliters |
| Solids Content | (wt. of dried sample/wt. of initial sample) × 100 and determined as described below |
| cm | Centimeter |
| μm | micrometer |
| mm | millimeters |
| kPag | Killopascals gauge |
| DIPAC | Diisopropylaminochlorosilane |
| DIPA | Diisopropylamine |
| DIPB | Diisopropyl benzene |
| TSA | Trisilylamine |
| TCS | Trichlorosilane |
| DiPB | 1,3-diisopropylbenzene |

Gas Chromatography-Thermal Conductivity Detector (GC-TCD) instrument and conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas was helium gas used at a flow rate of 105 mm per minute. GC instrument was an Agilent model 7890A gas chromatograph. Inlet temperature was 200° C. GC experiment temperature profile consisted of soaking (holding) at 50° C. for 2 minutes, ramping temperature up at a rate of 15° C./minute to 250° C., and then soaking (holding) at 250° C. for 10 minutes. GC-TDC was used to characterize the products and reactants in the following examples.

Example 1—DIPAC Synthesis

At ambient temperature and pressure, DIPA was added drop-wise from an addition funnel to a flask equipped with a condenser and containing TCS at a mole ratio of DIPA:TCS from 1:7 to 1:10 to maintain the temperature below the boiling point of TCS. The reaction temperature raised from 20° C. to 30° C. The reaction mixture was filtered using a plate filter to remove the byproduct salt. The reaction mixture was then heated to 100° C. to strip off the TCS and leave the DIPAC product.

Comparative Example 1—Synthesis of DIPAS Via Reduction of DIPAC with LiAlH₄

To a −20° C. chilled reactor containing a chilled mixture of DIPAC with DIPB was added a mixture of 20% LiAlH₄ in diethyl ether drop wise from an addition funnel, while maintaining a temperature below 10° C. The mass ratio of DIPAC to DIPB was 3:1. A 25% (w/w) excess of LiAlH₄ was used. Once all the LiAlH₄ was fed to the reactor, the reaction was maintained at −11° C. for two hours. A vacuum was then pulled to 1.3 kPa, and the temperature of the reactor pot raised to 77° C. pot raised to strip off DIPAS produced by the reaction from the pot through a condenser. A yield of 58% of DIPAS was achieved.

Comparative Example 2—Synthesis of DIPAS Via Reduction of DIPAC with LiAlH₄

To a −20° C. chilled reactor containing a chilled mixture of DIPAC with DIPB was added a mixture of 20% LiAlH₄ in diethyl ether drop wise from an addition funnel, while maintaining a temperature below 10° C. The mass ratio of DIPAC to DIPB was 5:1. A 15-20% (w/w) excess of LiAlH₄ was used. Once all the LiAlH₄ was fed to the reactor, the reaction was maintained at −0° C. for ten days. For one batch, a vacuum was then pulled to 1.3 kPa, and the temperature of the reactor pot raised to 40° C. to strip off DIPAS. For another batch, vacuum was pulled to 0.9 kPa, reflux was established, and the temperature of the reactor pot was raised to 72° C. to distill DIPAS off. The yield of the first and second batch were 62 and 63% (w/w), respectively.

Example 2—Synthesis of DIPAS Via Dehydrocoupling

A 250 mL PARR reactor was loaded with 11 g n-decane, 7.02 g DIPA, 0.4 mL of 1.0 M di-n-butylmagnesium. The reactor headspace was evacuated and repressurized to 1500 kPa with monosilane gas. The PARR reactor was then heated to and held at 80° C.+/−8° C. for 24 h then cooled to ambient temperature. After cooling the reactor, the headspace was purged and the reactants analyzed to find that 18.672 g of crude product was produced that consisted of 78.75% DiPAS, 20.41% DIPA and 0.84% of bis(diisopropylamino)silane and solvent giving a yield of DIPAS of 66.3% (w/w).

Example 3—Synthesis of DIPAS Via Dehydrocoupling

A 250 mL PARR reactor was loaded with 10.01 g DiPB, 7.01 g DIPA, 0.30 g of B(C₆F₅)₃. The reactor headspace was evacuated and repressurized to 655 kPa with monosilane gas. The PARR reactor was then heated to and held at 80° C.+/−8° C. for 4.5 h then cooled to ambient temperature. After cooling the reactor, the headspace was purged and the reactants analyzed to find that 16.98 g of crude product was produced that consisted of 0.96% (w/w) DiPAS, 98.53% (w/w) DIPA and 0.51% (w/w) of bis(diisopropylamino)silane and solvent. The yield of DIPAS of 0.7% (w/w), based on DIPA loading.

Example 4—TSA Synthesis Via Transamination with DIPAS

A 250 mL PARR reactor was loaded with 27.1 g of 90% (w/w) DIPAS mixed with 83.4 g of DIPB with an additional 83.0 g of additional DIPB fed into reactor to clear line of DIPAS. The reactor headspace was evacuated and repressurized to 241 kPa with anhydrous ammonia. The pressure reduced to 8 psi after 15 minutes. The PARR reactor was then heated to and held at 63° C. The headspace was purged and the reactants analyzed to find a 35% yield of TSA in DIPB.

Example 5—TSA Synthesis Via Transamination with DIPAS

A 250 mL PARR reactor chilled to −10° C. was loaded with 320 g of DIPAS. A vacuum was pulled on the reactor headspace and then the headspace was repressurized to 107 kPa with anhydrous ammonia. Ammonia feed to the reactor was continued to maintain the pressure at 107 kPa until ammonia consumption ceased. The pressure reduced to 8 psi after 15 minutes. The PARR reactor was then heated to and held at 63° C. The headspace was purged and the reactants analyzed to find a 35% yield of TSA in DIPB. The reactor pot temperature raised and level off at 13° C. The reaction mixture was analyzed by GC and 85% (w/w) of DIPAS to disilylamine (DSA) was observed. Loaded 160 g of 88% into reactor. The reactor was then heated to 40° C. for 2 h, and then 12 h at 0° C. The reaction product was then analyzed by GC and a 28% (w/w) conversion from DSA to TSA was observed.

The reaction product was then heated at 50° C. for 7 hours and the conversion from DSA to TSA increased to 56%. Next, the reactants were held at 30° C. for 16 h, then 70° C. for 2.5 hours, and the conversion from DSA to TSA increased to 87%. Next, the reactants were held at 0° C. for 48 h, then 70° C. for 2 hours, and the conversion from DSA to TSA increased to 91%. The reaction product TSA was stripped overhead at 55° C. and 32 kPa. An overall TSA yield of 80% achieved: 223 g of 42% pure TSA (46% DIPA). Finally, the reaction product was distilled to 94% (w/w) TSA purity.

That which is claimed is:

1. A method of making a silylamine, the method comprising: combining ammonia and a compound comprising aminosilane functionality, where the compound comprising aminosilane functionality is according to formula (I)

$$R^1N(R^2)_a(SiH_3)_{2-a} \qquad (I),$$

where $R^1$ is an organic polymer, a $C_{1-20}$ hydrocarbyl group or $-SiR^3_3$, where $R^3$ is $C_{1-6}$ hydrocarbyl, $R^2$ is a $C_{1-20}$ hydrocarbyl group, H, or $-SiR^3_3{}^1$, where $R^3$ is as defined above, subscript a is 0 or 1, provided that $R^1$ and $R^2$ may be the same or different except if $R^1$ is phenyl, $R^2$ is not phenyl, under sufficient conditions to cause a reaction to form a silylamine and a byproduct; and wherein the sufficient conditions include a temperature from −20° C. to 150° C. and a pressure greater than 102 kPa.

2. A method according to claim 1 wherein the silylamine is trisilylamine, $N(SiH_3)_3$.

3. A method as in claim 1, wherein the temperature is from 0° C. to 75° C.

4. A method as in claim 1, wherein $R^1$ is alkyl and each $R^2$ is independently $R^1$ or H.

5. A method as in claim 4, wherein $R^1$ is branched alkyl having 3 to 6 carbon atoms, and each $R^2$ is independently $R^1$ or H.

6. A method according to claim 1, wherein the combining is in a pressure reactor.

7. A method as in claim 1, wherein the pressure of the sufficient conditions is up to 300 kPa.

8. A method of making a silylamine, the method comprising: combining ammonia and a compound comprising aminosilane functionality, wherein the compound comprising aminosilane functionality is an organic polymer comprising one or more groups according to formula (II)

(II)

where $R^2$ is H, $C_{1-20}$ hydrocarbyl, or $-Si(R^3)_3$, where $R^3$ is $C_{1-6}$ hydrocarbyl, subscript a and b independently are 0 or 1, and a+b<2, where the groups according to formula (II) are in pendant, terminal, or pendant and terminal positions on the organic polymer.

* * * * *